United States Patent [19]

Corso

[11] 4,338,531
[45] Jul. 6, 1982

[54] SLIDE WIRE DEVICE SIMULATOR CIRCUIT AND METHOD

[75] Inventor: Anthony B. Corso, Cincinnati, Ohio

[73] Assignee: Corporate Equipment Company, Cincinnati, Ohio

[21] Appl. No.: 187,257

[22] Filed: Sep. 15, 1980

[51] Int. Cl.³ .................. G05F 1/44; G05F 1/613
[52] U.S. Cl. .................. 307/540; 307/264; 307/490; 323/233
[58] Field of Search ............ 307/264, 490, 493, 540, 307/555, 557, 567; 323/233, 353

[56] References Cited

U.S. PATENT DOCUMENTS

| 3,505,606 | 4/1970 | Werner | 328/146 |
|---|---|---|---|
| 3,787,778 | 1/1974 | Carre et al. | 330/109 |
| 3,803,423 | 4/1974 | Libby | 307/98 |
| 3,875,428 | 4/1975 | Le Blanc et al. | 307/490 |
| 3,979,654 | 9/1976 | Guicheteau et al. | 318/599 |
| 4,015,192 | 3/1977 | Koyanagi | 323/19 |
| 4,020,361 | 4/1977 | Suelzle et al. | 307/106 |
| 4,110,834 | 8/1978 | Altwein | 307/490 |
| 4,161,023 | 7/1979 | Goffeau | 363/124 |

*Primary Examiner*—John Zazworsky
*Attorney, Agent, or Firm*—Biebel, French & Nauman

[57] ABSTRACT

A circuit for simulating a slide wire device includes a pair of resistors connected electrically in series with a reference voltage source. Switching means are provided for alternately shorting the resistors in a duty cycle fashion such that when one of the resistors is shorted, the other resistor is unshorted. By adjusting this duty cycle, the output provided by the circuit is adjusted and a slide wire device simulated.

10 Claims, 6 Drawing Figures

SLIDE WIRE DEVICE SIMULATOR CIRCUIT AND METHOD

BACKGROUND OF THE INVENTION

The present invention relates to a method and apparatus for simulating a variable voltage attenuator and, more particularly, to a method and a circuit for simulating electrically a slide wire device.

In its simplest form, an electrical slide wire device consists of a length of electrical resistance wire, which is wound on a wire support, and a sliding electrical contact which may be moved to contact electrically any of the turns of the wire along its length. When a reference voltage is applied to the ends of the length of resistance wire, the voltages between the sliding contact and the ends of the wire is directly related to the position of the contact. In effect, the slide wire device becomes a voltage divider or attenuator.

Slide wire devices have been utilized in the past in motor control systems. In a typical system of this type, the motor position is sensed by mechanically linking the sliding contact of a first slide wire device to the motor shaft. When the motor is actuated, the sliding contact is moved correspondingly and the voltage output from the sliding contact provides an indication of the position of the motor shaft. A second slide wire device, also having a reference potential placed thereacross, is utilized to provide a signal related to the desired position of the motor shaft. The outputs from the sliding contacts of the two slide wire devices are then compared by an amplifier/comparator circuit to produce a motor control signal supplied to the motor. As the position of the sliding contact of the second slide wire device is altered, the motor is actuated in such a manner as to move the sliding contact of the first slide wire device to a position in which the outputs from the two sliding contacts are essentially equal. The position of the sliding contact of the second slide wire device may be set manually or, alternatively, may be connected mechanically to a sensor device of some sort which determines the desired position of the motor shaft. Such a conventional prior art slide wire control arrangement is illustrated in U.S. Pat. No. 3,505,606, issued Apr. 7, 1970, to Werner.

A problem develops, however, when it is desired to add an electronic control to a pre-existing control system which utilizes such a pair of slide wire devices. Specifically, it is necessary to provide some arrangement by which a low level signal can be utilized to control the setting of the second slide wire device, so as to provide the signal indicative of the desired position of the motor.

U.S. Pat. No. 3,979,654, issued Sept. 7, 1976, to Guicheteau et al, discloses a circuit which provides for slide wire control of a motor in dependence upon an external control signal. In the Guicheteau et al circuit, a separate motor is driven under control of an external signal to move the sliding contact of the slide wire device to a position such that an appropriate signal output is derived for control of the other motor in the system. It will be appreciated that such a system, including a second motor, is relatively expensive and, further, results in additional complications in circuitry.

A number of electrical circuits have been developed which provide a variable resistance in response to a controlling input signal. Such circuits are shown, for instance, in U.S. Pat. No. 4,015,192, issued Mar. 29, 1977, to Koyanagi, and U.S. Pat. No. 3,803,423, issued Apr. 9, 1974, to Libby. The Libby patent discloses a circuit in FIG. 2 in which a pair of mutually exclusive transistor switching devices are alternately switched ON to connect one or the other of a pair of resistors into the circuit for selected periods of time. The relative connection and disconnection time intervals are controlled as a function of an input signal. The resistance simulated by this switching technique is a resistance intermediate the resistances of the resistors and is dependent upon the percentage of the time during each switching cycle that each of these resistors is connected in the circuit.

The Koyanagi patent discloses a circuit in which various combinations of a plurality of resistors are switched into the circuit to produce any of a plurality of reference voltages. The resistors are essentially connected electrically in parallel. The cyclically changing voltage produced by switching the various combinations of resistors into the circuit is integrated and smoothed. By controlling the duty cycle of the switching pulse signals, the magnitude of the output voltage is controlled. Although the Libby and Koyanagi patents disclose circuits which simulate electrically a variable resistor, the circuits cannot be utilized in place of a slide wire type voltage divider, and therefore may not be incorporated into a slide wire control system to permit electronic control thereof.

It is seen, therefore, that a need exists for a circuit which may be substituted in place of a slide wire device in an existing control system to simulate slide wire operation while permitting control of the simulated slide wire device by a low level signal.

SUMMARY OF THE INVENTION

A variable electrical attenuator circuit for providing a controlled electrical output when connected to a reference voltage source, said variable electrical attenuator circuit being responsive to an input signal supplied thereto, includes first and second electrical impedance means, each of which provides a predetermined impedance. The first and second electrical impedance means, which may each comprise a resistor, are connected electrically in series. A means for connecting the reference voltage source in series electrical connection with the serial combination of the first and second electrical impedance means is provided. An electrical switching means is responsive to a switch control signal for electrically shorting either of the first and second electrical impedance means while leaving the other of the electrical impedance means unshorted. Cyclically varying switch control signals are provided by appropriate means to the electrical switching means in response to the input signal to short alternately the first and second electrical impedance means, whereby the controlled electrical output signal is provided across the impedance means.

A method for simulating a variable electrical slide wire device comprises the steps of:

(a) connecting a pair of resistors in electrical serial connection, (b) applying a reference voltage across the pair of serially connected resistors, and (c) alternately shorting the resistors in a cyclical manner such that when one of the resistors is shorted, the other of the resistors is not shorted, whereby the electrical potential across one of the pair of resistors simulates the output of a slide wire device.

The step of alternately shorting the resistors may include the step of alternately shorting the resistors at a substantially uniform frequency of varying duty cycle such that the average potentials across the resistors are dependent upon the duty cycle.

Accordingly, it is an object of the present invention to provide a circuit for simulating electrically a slide wire device with the apparent setting of the simulated slide wire device being dependent upon an input signal; to provide such a circuit which includes a pair of serially connected impedances which are alternately shorted electrically; to provide such a circuit in which the electrical impedances are resistors; to provide such a circuit in which a reference voltage may be applied across the serial combination of the resistors and in which the simulated slide wire output appears across one of the resistors; to provide such a circuit in which the resistors are electrically shorted in a duty cycle fashion and in which the output of the circuit is dependent upon the duty cycle; and to provide such a circuit in which shorting of the resistors is dependent upon a pulse width modulated signal provided in response to the input signal supplied to the circuit.

Other objects and advantages of the invention will be apparent from the following description, the accompanying drawings and the appended claims.

DETAILED DESCRIPTION OF THE PREFERRED EMBODIMENT

Figure 1:
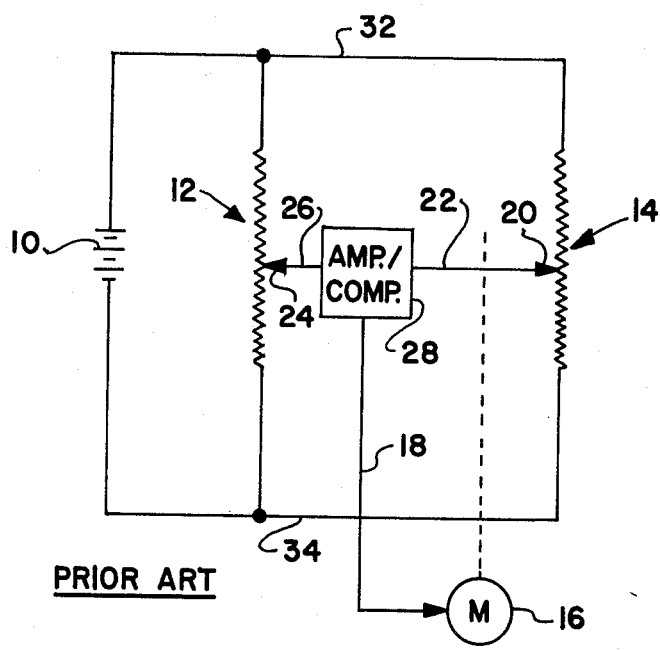
FIG. 1 is an electrical schematic diagram illustrating a prior art slide wire control system.

FIG. 1 illustrates a prior art control system of the type utilizing a pair of slide wires for feedback control of the position of a motor. A reference voltage source 10 is connected across a pair of slide wire devices 12 and 14 to provide a substantially constant voltage thereacross. Although voltage source 10 is illustrated as a D.C. voltage source, it should be understood that it is quite common to utilize an A.C. voltage source in such systems, and that an A.C. source may be utilized in the circuit of FIG. 1 with proper choice of components. Motor 16 is actuated by a motor control signal on line 18 in order to drive the motor 16 to a desired position. The motor shaft is mechanically linked to the sliding contact 20 of slide wire 14. Since the slide wire device 14 acts as a voltage divider, it will be appreciated that the voltage output from slide wire device 14 on line 22 will be directly related to the actual motor shaft position.

The output from sliding contact 24 of the slide wire device 12 is supplied to line 26 and this output, which is dependent upon the position of the sliding contact 24, provides an indication of the desired position of the shaft of motor 16. An amplifier/comparator circuit 28 compares the outputs from lines 22 and 26 and derives a motor control signal which is supplied to line 18 to cause the actual position of the motor shaft to move toward the desired position.

Although the slide wire device 12 could be manually adjusted to control motor 16, it is quite common in such systems to provide a mechanism by which the slide wire device 12 is automatically adjusted in response to a condition affected by rotation of the motor 16. If, for example, motor 16 were to be connected to dampers in a ventilation system, the slide wire device 12 might be actuated by a temperature responsive mechanism, such as a bimetal device. Thus, the motor may be controlled to adjust damper position in dependence upon fluctuations in temperature, as sensed by the bimetal device.

Similar control systems have been used in the past in numerous applications. It will be appreciated, however, that an existing slide wire control system, such as illustrated in FIG. 1, does not readily lend itself to adaptation to computer control. One approach which has been used is to utilize a second motor to move the sliding contact 24 of slide wire device 12 and control operation of this motor by means of the computer. Such a motorized control arrangement is disclosed in the above cited patent to Guicheteau et al. It will be appreciated, however, that the inclusion of a separate motor for controlling the position of the sliding contact 24 would substantially complicate the control system and add to its costs significantly.

The control system of FIG. 1 may not be adapted for electronic control simply by substituting a variable impedance, such as shown in the above cited patents to Koyanagi and Libby, since an amplifier/comparator circuit 28 in an existing control system is designed for use with a specific slide wire device 12. Rather, a circuit, such as that disclosed in the present invention, which simulates a slide wire device both as to the output signal voltage and current and as to the input and output impedances, is required.

Figure 2:
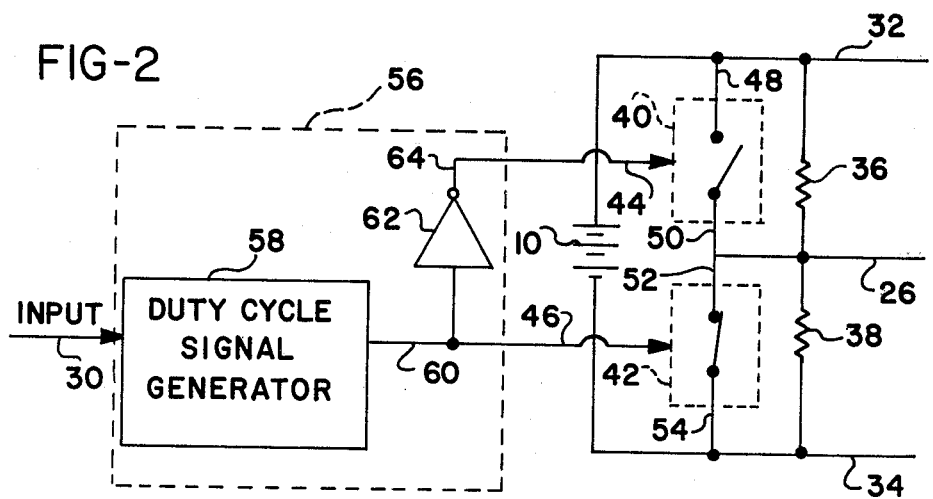
FIG. 2 is an electrical schematic diagram illustrating a circuit constructed according to the present invention.

Reference is now made to FIG. 2 of the drawings which illustrates schematically a circuit for simulating electrically a slide wire device with the apparent setting of the slide wire device being dependent upon an input signal on line 30. The circuit of FIG. 2 may be substituted directly for the slide wire device 12 in the control system of FIG. 1 to permit control of the apparent setting of the slide wire simulator in response to fluctuations in the input signal on line 30. To make such a substitution, slide wire device 12 is removed and the simulator circuit is connected as indicated to conductors 26, 32, and 34.

The circuit of FIG. 2 comprises first and second electrical resistors 36 and 38, which are electrically connected in series. First and second electrical switching means 40 and 42, are provided, with control inputs on lines 44 and 46, respectively. Switching means 40 and 42 are illustrated in FIG. 2 as mechanical single pole, single throw switches but are preferably implemented as solid state switching devices. Each of the switching devices 40 and 42 provides electrical connection between respective switch terminals 48, 50, 52, and 54 in response to a switch control signal applied to respective control input lines 44 and 46.

The first electrical switching means 40 is connected electrically in parallel with the first electrical resistor 36. Similarly, the second electrical switching means 42 is connected electrically in parallel with the second resistor 38. Reference voltage means 10 is provided for applying a reference voltage across the series connection of the first and second resistors 36 and 38. As indicated previously, although the reference voltage means 10 is shown as a D.C. voltage source, a reference A.C. voltage source may be utilized in many control system applications.

A means 56, responsive to the input signal on line 30, provides switch control signals on lines 44 and 46 to the control inputs of the first and second switching means 40 and 42. The switch control signals on lines 44 and 46 are provided in such a manner as to actuate cyclically the first and second switching means to opposite switching states. When one of the first and second switching means is closed, the other of the first and second switching means is open, in a mutually exclusive switch actuation pattern. As a consequence, the first and second resistors 36 and 38 are alternately shorted electrically and outputs are provided across the resistors 36 and 38 which simulate a slide wire device in output voltage, current, and impedance.

The means 56 for providing the switch control signals includes a duty cycle generator circuit 58, responsive to the input signal on line 30, for providing pulse width modulated signals to the control inputs of the first and second switching means 40 and 42. The duty cycle circuit means 58 generates a first pulse width modulated signal on line 60 which is supplied to the second electrical switching means 42. An inverter means 62 is provided for inverting the pulse width modulated signal on line 60 and supplying a second pulse width modulated signal to the second electrical switching means 40 via line 64. It may be desirable in certain applications to provide resistors 36 and 38 of equal electrical resistance.

In operation, the resistors 36 and 38 are alternately electrically shorted. At any given point in time, one of the resistors 36 and 38 will be shorted and the other of the resistors 36 and 38 will not be shorted. As a consequence, the apparent resistance across the serial combination of resistors 36 and 38, assuming these resistors are of equal resistance values, will be equal to the resistance of one of the resistors. Each of resistors 36 and 38 will therefore preferably be selected such that the resistance thereof is the same as the total resistance of the slide wire device which is replaced.

Due to the mutually exclusive switching of switching means 40 and 42, the voltage across resistor 38, will alternate between zero volts and the voltage provided by voltage source 10. The average voltage across resistor 38 will therefore be proportional to the percentage of time that resistor 38 is unshorted. Similarly, the average voltage provided across resistor 36 will be proportional to the percentage of time that resistor 36 is unshorted. By varying the duty cycle of the switch control signals, it is therefore possible to alter the average voltage provided across resistors 36 and 38, with the average voltage across one of the resistors decreasing as the average voltage across the other resistor increases, precisely in the manner in which the voltage across slide wire segments to either side of the sliding contact is varied during movement of the sliding contact. In like manner, the average output impedance between lines 26 and 32 and between lines 26 and 34 is varied in dependence upon the percentage of the time that the resistors are unshorted.

Since the amplifier/comparator circuit utilized in a typical slide wire control system is relatively show acting, such a circuit tends to integrate the output voltage levels provided by the simulator circuit of FIG. 2 with the result that the motor is controlled in response to average voltage levels sensed. If the circuit of FIG. 2 is to be utilized to simulate a variable voltage divider in a system in which this integration is not inherent, it may be desirable to provide smoothing filter circuits on the output lines 26, 32, and 34.

Figure 3A:
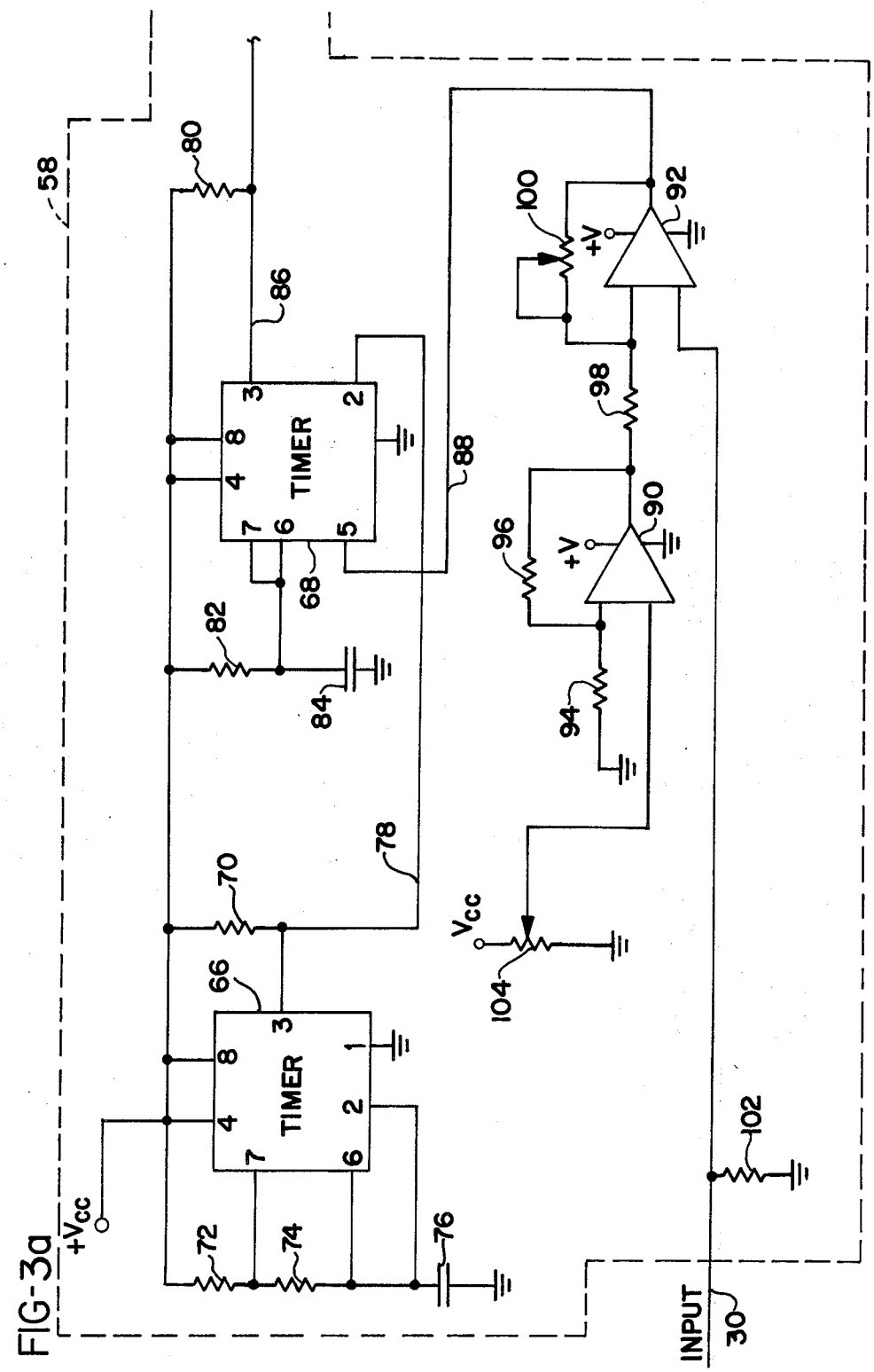
FIGS. 3(a) and 3(b), when assembled with FIG. 3(a) to the left of FIG. 3(b), form an electrical schematic diagram illustrating in greater detail the circuit of FIG. 2.
Figure 3B:
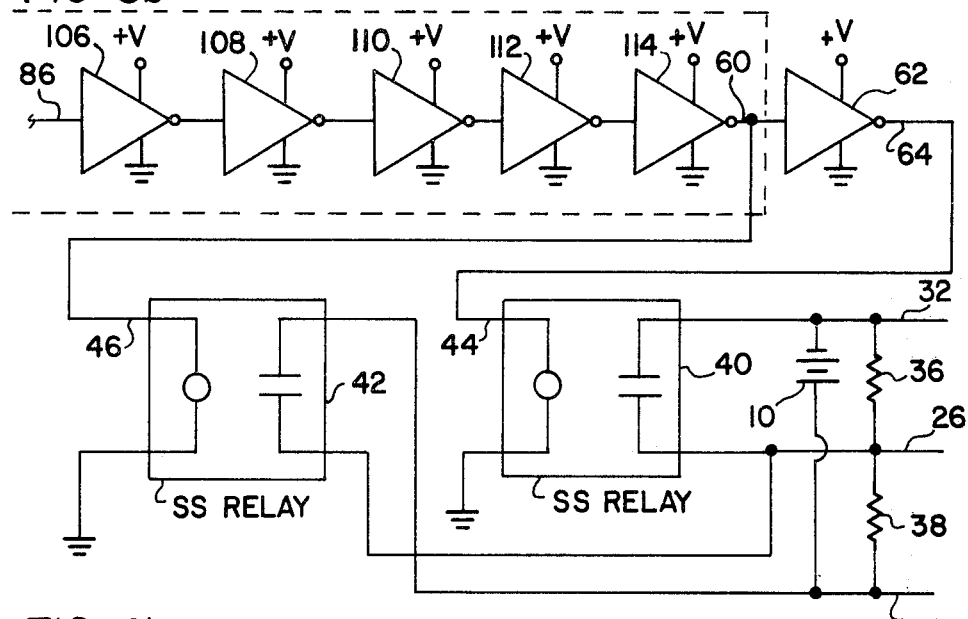

Reference is now made to FIGS. 3(a) and 3(b) which together illustrate in greater detail a circuit constructed according to the present invention. Resistors 36 and 38 are connected electrically in series with voltage source 10 as described previously. Switching means 40 and 42 each comprises a solid state relay which, when actuated by an appropriate switch control signal on lines 44 and 46, shorts out the associated resistor 36 or 38, respectively.

Duty cycle signal generator circuit 58 includes a pair of integrated circuits 66 and 68, each comprising an integrated circuit timer chip SN555, available from Signetics Corp., Sunnyvale, California. Circuit 66, along with associated resistors 70, 72, 74, and capacitor 76, comprises an oscillator circuit which produces an oscillation output signal on line 78 which determines the rate at which the switching means 40 and 42 are alternately actuated. Timer circuit 68, in conjunction with resistors 80, 82, and capacitor 84, comprises a timer circuit which receives the oscillation output signal on line 78 and provides a pulse width modulated output signal on line 86 which is identical in frequency, but which varies in duty cycle in dependence upon a signal supplied to circuit 68 on line 88.

The control signal for line 88 is produced by summing amplifiers 90 and 92 which, in conjunction with resistors 94, 96, 98, and 100, sum the input signal voltage appearing across resistor 102 with a reference signal provided by the variable voltage divider 104.

The output of circuit 68 on line 86 is supplied through a series of amplifiers 106, 108, 110, 112, and 114, to line 60. Inverter 62 inverts this signal such that mutually exclusive switching by solid state relays 40 and 42 is provided. The components utilized in the circuit of FIGS. 3(a) and 3(b) are as follows:

| Reference Numeral | Component Value |
| --- | --- |
| 70 | 1K ohms |
| 72 | 80K ohms |
| 74 | 10K ohms |
| 76 | 1 microfared |
| 80 | 1K ohms |
| 82 | 100K ohms |
| 84 | 1 microfared |
| 94 | 825K ohms |
| 96 | 825K ohms |
| 98 | 825K ohms |
| 100 | 0-1 megohm |
| 102 | 156.25 ohms |
| 104 | 0-100 ohms |

Figure 4B:
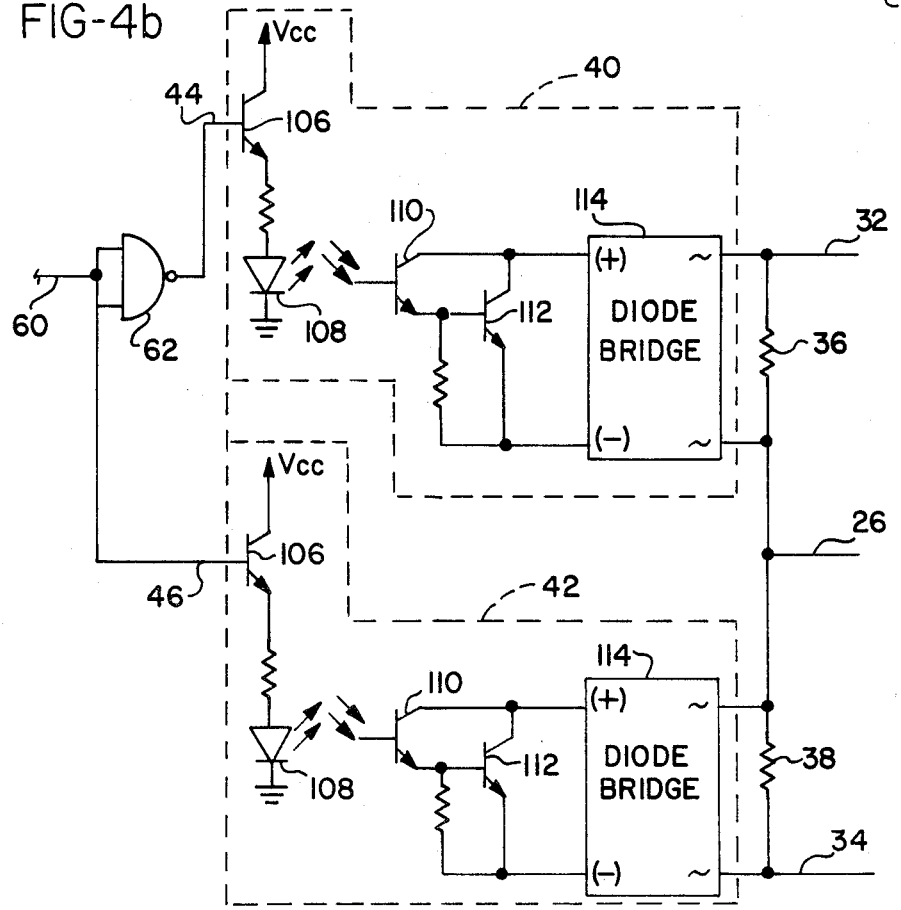
FIGS. 4(a) and 4(b), when assembled with FIG. 4(a) to the left of FIG. 4(b), form an electrical schematic diagram of a circuit constructed according to the principles of the present invention.
Figure 4A:
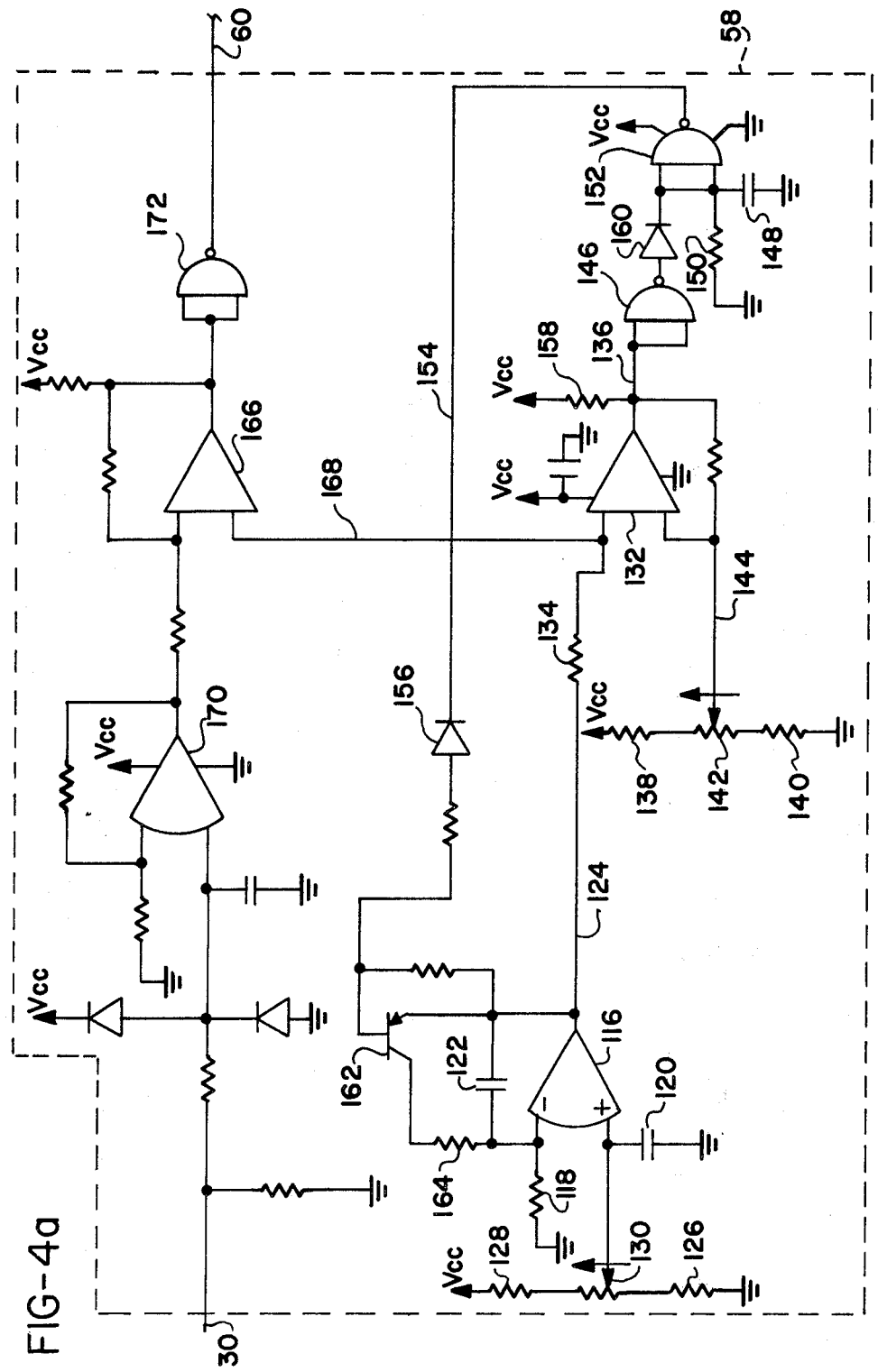

FIGS. 4(a) and 4(b), when assembled with FIG. 4(a) to the left of FIG. 4(b), illustrate schematically an electrical circuit which, while not designed in its specifics by applicant, also embodies the present invention. Resistors 36 and 38 are connected electrically in parallel with a reference voltage source, not shown, which may be an A.C. reference voltage source. Switching means 40 and 42 are substantially identical. Each switching means includes a transistor 106 which, when switched ON by a high signal on its base input, supplies power to an associated light-emitting diode 108. Diode 108 is optically coupled to a photosensitive transistor 110, such that when the diode 108 is energized, transistors 110 and 112 are switched ON. Diode bridge circuits 114 are provided to permit the associated transistors 112 to handle current flow from the reference voltage source during both halves of an A.C. cycle, thus shorting the associated resistor 36 or 38. The NAND gate 62 acts as an inverter, such that the switching means 40 and 42 are actuated during alternate portions of the duty cycle pulse width modulated signal supplied to line 60.

Duty cycle signal generator circuit 58 provides a pulse width modulated signal output on line 60 in response to a control input on line 30. The pulse width modulated signal for line 60 is generated as follows. Amplifier 116 and associated resistor 118 and capacitors 120 and 122, are connected as an integrator which provides a positive-going ramp signal on line 124, the slope of which is dependent upon the voltage provided by resistors 126, 128, and variable voltage divider 130. The positive-going ramp signal is supplied to comparator 132 via resistor 134. Comparator 132 provides a positive output signal on line 136 as a result of a reference voltage supplied thereto by resistors 138, 140, and variable voltage divider 142, until the signal on line 124 exceeds the reference level on line 144. Inverter NAND gate 146 inverts this positive output, and as a result, capacitor 148 remains discharged through resistor 150. NAND gate 152 therefore supplies a positive signal to line 154 which is blocked by diode 156.

When the positive-going ramp signal on line 124 exceeds the reference threshold level as determined by the voltage on line 144, however, the output of comparator 132 goes low and capacitor 148 is charged through diode 160. The output of NAND gate 152 therefore goes low, switching transistor 162 ON and thus shorting capacitor 122 through resistor 164. The positive-going ramp signal on line 124 is therefore terminated, and the signal on line 124 declines at a rapid rate. Even though comparator 132 reverses its output, NAND gate 152 continues to keep transistor 162 switched ON during a period of time determined by the RC time constant of capacitor 148 and resistor 150. When capacitor 148 is discharged, however, the transistor 162 is switched OFF and a new positive-going ramp signal is initiated on line 124. This saw-toothed shaped signal is supplied to comparator 166 via line 168 and is compared with the incoming control signal on line 30, which signal has previously been adjusted in level by amplifier 170 and associated circuit components. The output of comparator 166 alternates between high and low output states as the ramp signal on line 168 alternately exceeds and then drops below the adjusted level control input signal. Thus, changing the input signal on line 30 results in altering the duty cycle of the pulse width modulated signal supplied to line 60 via NAND gate inverter 172 by comparator 166.

Several points should be noted. First, the present invention provides an apparatus and a method for simulating a slide wire device in output signal and in impedance, but this simulation is accomplished on an average basis. When the output of the present invention is to be supplied to a circuit capable of responding within half of a switching cycle of the switching means, it may be necessary to add filtering on the output of the circuit so as to smooth the output signals somewhat. Additionally, although the present invention has been described in the context of adapting a slide wire control system to electronic control, it will be appreciated that it will find applications in many other areas in which simulating a variable voltage divider for attenuator is required.

While the method herein described and the form of apparatus for carrying this method into effect, constitute preferred embodiments of the invention, it is to be understood that the invention is not limited to this precise method and form of apparatus, and that changes may be made in either without departing from the scope of the invention.

What is claimed is:

1. A circuit for simulating electrically a slide wire device with the apparent setting of said slide wire device being dependent upon an input signal, comprising:
    first and second electrical resistors, connected electrically in series,
    first and second electrical switching means, each having a control input and a pair of switch terminals, and each providing electrical connection between said switch terminals in response to a switch control signal applied to said control input, said first electrical switching means connected electrically in parallel with said first electrical resistor, and said second electrical switching means connected electrically in parallel with said second resistor,
    reference voltage means for applying a reference voltage across the series connection of said first and second resistors, and
    means, responsive to said input signal, for providing switch control signals to said control inputs of said first and second switching means to actuate cyclically said first and second switching means to opposite switching states, whereby one of said first and second switching means is closed when the other of said first and second switching means is open such that said first and second resistors are alternately shorted electrically, and whereby outputs are provided across said first and second resistors which simulate a slide wire device in output impedance and output voltage levels.

2. The circuit of claim 1 in which said means for providing switch control signals, comprises
    duty cycle signal generator means, responsive to said input signal, for providing pulse width modulated signals to said control inputs of said first and second switching means, the duty cycles of said pulse width modulated signals being dependent upon said input signal.

3. The circuit of claim 2 in which said duty cycle generator means comprises:
    duty cycle circuit means, responsive to said input signal, for generating a first pulse width modulated signal,
    means for supplying said first pulse width modulated signal to said second electrical switching means, and
    inverter means for inverting said first pulse width modulated signal and supplying a second pulse width modulated signal to said second electrical switching means.

4. The circuit of claim 1 in which said first and second resistors are of substantially equal electrical resistance.

5. The circuit of claim 1 in which each of said first and second switching means comprises a solid state switching circuit.

6. A variable electrical attenuator circuit for providing a controlled electrical output when connected to a reference voltage source, said variable electrical attenuator circuit being responsive to an input signal supplied thereto, comprising:

first and second electrical impedance means, each of said electrical impedance means providing a predetermined impedance, said first and second electrical impedance means being connected electrically in series, means for connecting said reference voltage source in series electrical connection with the serial combination of said first and second electrical impedance means, electrical switching means, responsive to a switch control signal, for electrically shorting either of said first and second electrical impedance means while leaving the other of said electrical impedance means unshorted, and means for providing cyclically varying switch control signals to said electrical switching means in response to said input signal to short alternately said first and second electrical impedance means, whereby said controlled electrical output is provided across one of said impedance means.

7. The attenuator circuit of claim 6 in which said means for providing cyclically varying switch control signals comprises means for providing switch control signals of substantially constant frequency and of variable duty cycle in response to said input signal.

8. The attenuator circuit of claim 6 in which each of said first and second electrical impedance means comprises an electrical resistor.

9. A method for simulating a variable electrical slide wire device, comprising the steps of:

connecting a pair of resistors in electrical serial connection, applying a reference voltage across the pair of serially connected resistors, and alternately shorting said resistors in a cyclical manner such that when one of said resistors is shorted, the other of said resistors is not shorted, whereby the electrical potential across one of said pair of resistors simulates the output of a slide wire device.

10. The method of claim 9 in which said step of alternately shorting said resistors includes the step of alternately shorting said resistors at a substantially uniform frequency of varying duty cycle such that the average potentials across said resistors are dependent upon the duty cycle.

* * * * *